(12) United States Patent
Lee et al.

(10) Patent No.: US 8,004,763 B2
(45) Date of Patent: Aug. 23, 2011

(54) PDP FILTER AND MANUFACTURING METHOD THEREOF

(75) Inventors: Dong-Wook Lee, Daejeon (KR); Yeon-Keun Lee, Daejeon (KR); In-Seok Hwang, Daejeon (KR); Seung-Wook Kim, Incheon (KR); Sang-Hyun Park, Daejeon (KR); Jung-Doo Kim, Daejeon (KR); Hyun-Seok Choi, Daejeon (KR); Su-Rim Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 619 days.

(21) Appl. No.: 11/794,683

(22) PCT Filed: Mar. 3, 2006

(86) PCT No.: PCT/KR2006/000749
§ 371 (c)(1),
(2), (4) Date: Jul. 3, 2007

(87) PCT Pub. No.: WO2006/115325
PCT Pub. Date: Nov. 2, 2006

(65) Prior Publication Data
US 2009/0268298 A1      Oct. 29, 2009

(30) Foreign Application Priority Data

Mar. 4, 2005 (KR) .................. 10-2005-0018294
Apr. 19, 2005 (KR) .................. 10-2005-0032392

(51) Int. Cl.
*G02B 1/10* (2006.01)

(52) U.S. Cl. ..................................... 359/585
(58) Field of Classification Search .............. 359/585, 359/883
See application file for complete search history.

(56) References Cited

U.S. PATENT DOCUMENTS

| | | | |
|---|---|---|---|
| 2003/0156080 A1* | 8/2003 | Koike et al. | 345/60 |
| 2004/0165297 A1 | 8/2004 | Kim et al. | |
| 2004/0198096 A1 | 10/2004 | Kim et al. | |
| 2005/0068648 A1* | 3/2005 | Yoshikai et al. | 359/883 |

FOREIGN PATENT DOCUMENTS

| | | |
|---|---|---|
| EP | 1 069 088 | 1/2001 |
| EP | 1 180 781 | 2/2002 |
| EP | 1 267 318 | 12/2002 |
| EP | 1 498 259 | 1/2005 |
| JP | 11-074683 | 3/1999 |
| JP | 2001-147245 | 5/2000 |
| JP | 2001-134198 | 5/2001 |
| JP | 2001-142406 | 5/2001 |
| JP | 2001-343898 | 12/2001 |
| JP | 2003-240907 | 8/2003 |
| JP | 2004-311664 | 11/2004 |

* cited by examiner

*Primary Examiner* — Joshua L Pritchett
(74) *Attorney, Agent, or Firm* — McKenna Long & Aldridge LLP

(57) ABSTRACT

Disclosed herein is a PDP filter having a laminated structure of a transparent conductive film type electromagnetic wave-shielding layer and one or more other functional layers, in which at least two edge portions of the surface of the transparent conductive film type electromagnetic wave-shielding layer, which is in contact with the functional layer, are not exposed outside the laminated structure of the PDP filter.

31 Claims, 8 Drawing Sheets

[Figure 1]
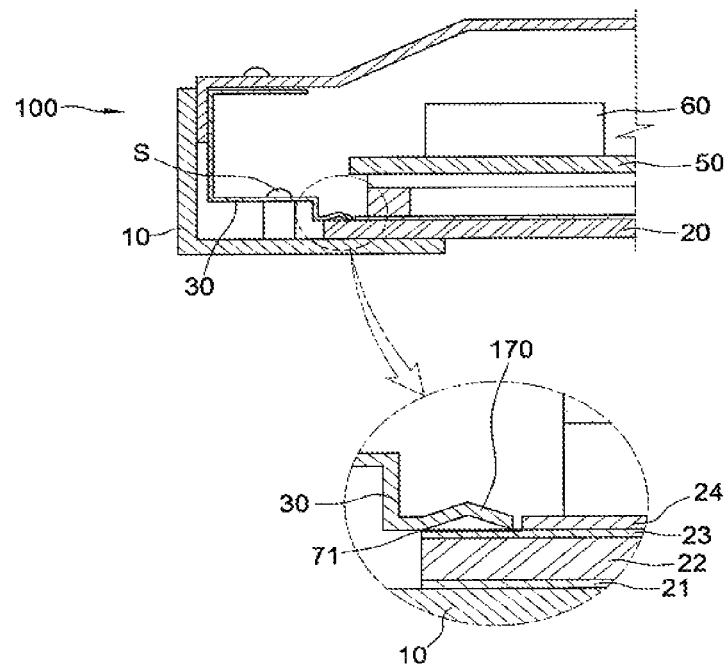
[Fig. 2]
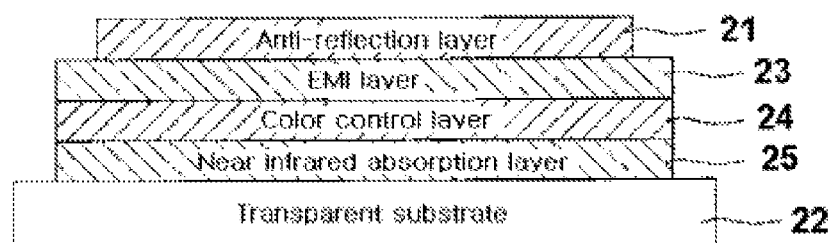
[Fig. 3]
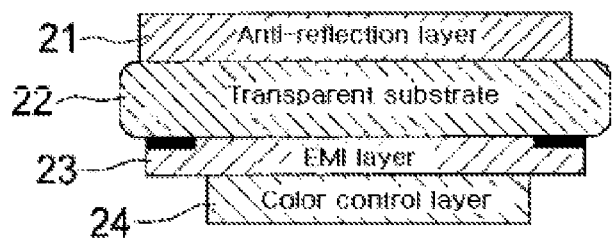
[Fig. 4]
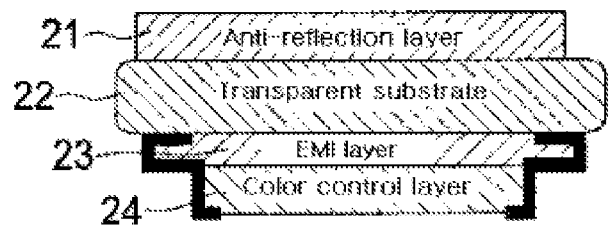

[Fig. 5]
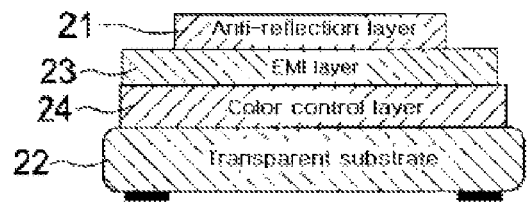
[Fig. 6]
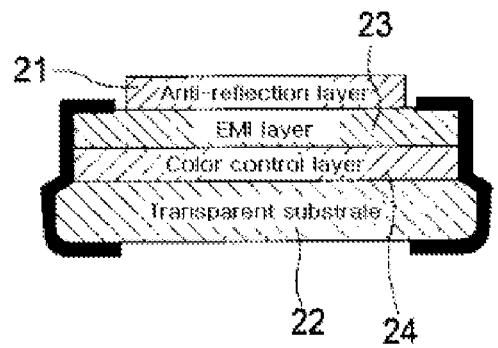
[Fig. 7]
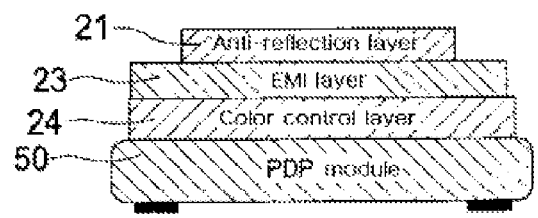
[Figure 8]
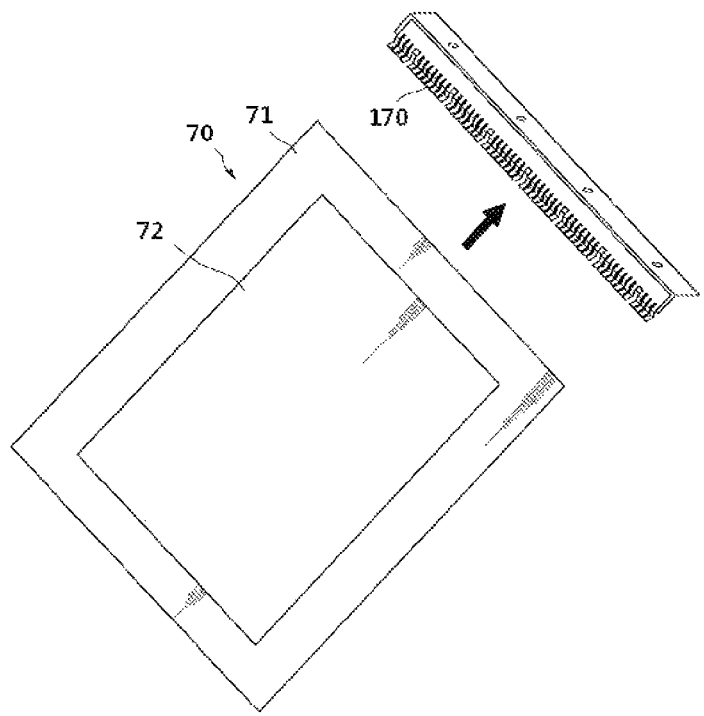

[Fig. 9]
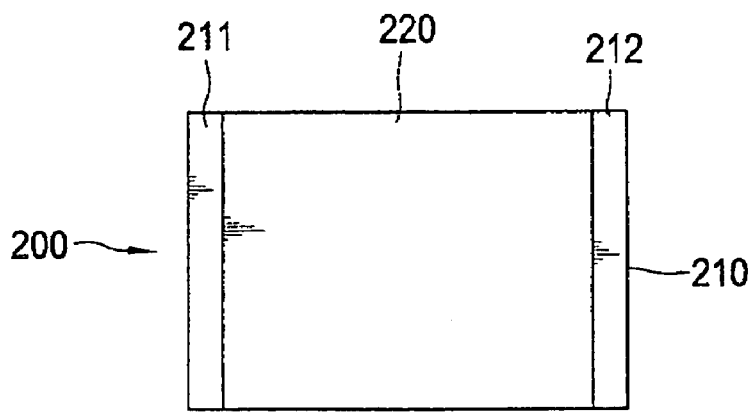
[Fig. 10]
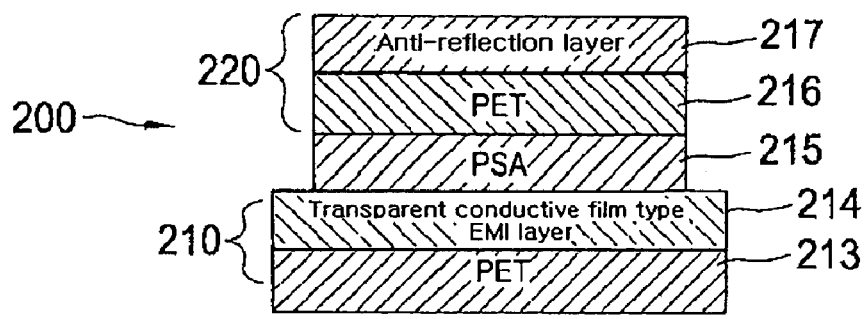
[Fig. 11]
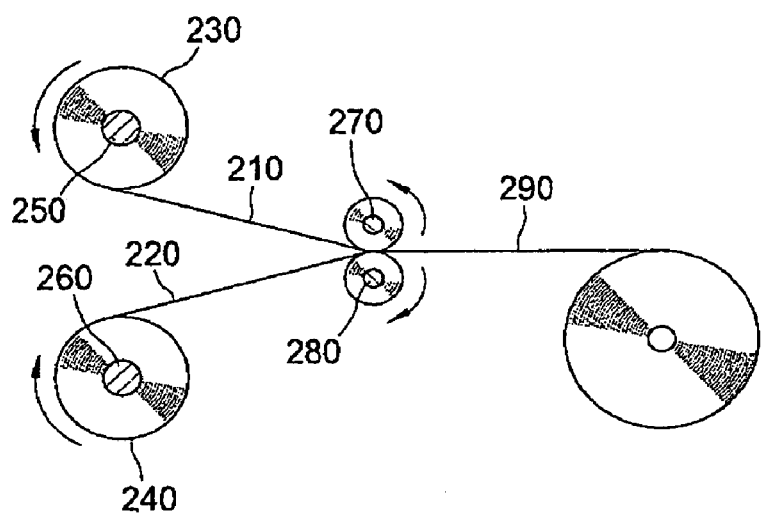

[Fig. 12]
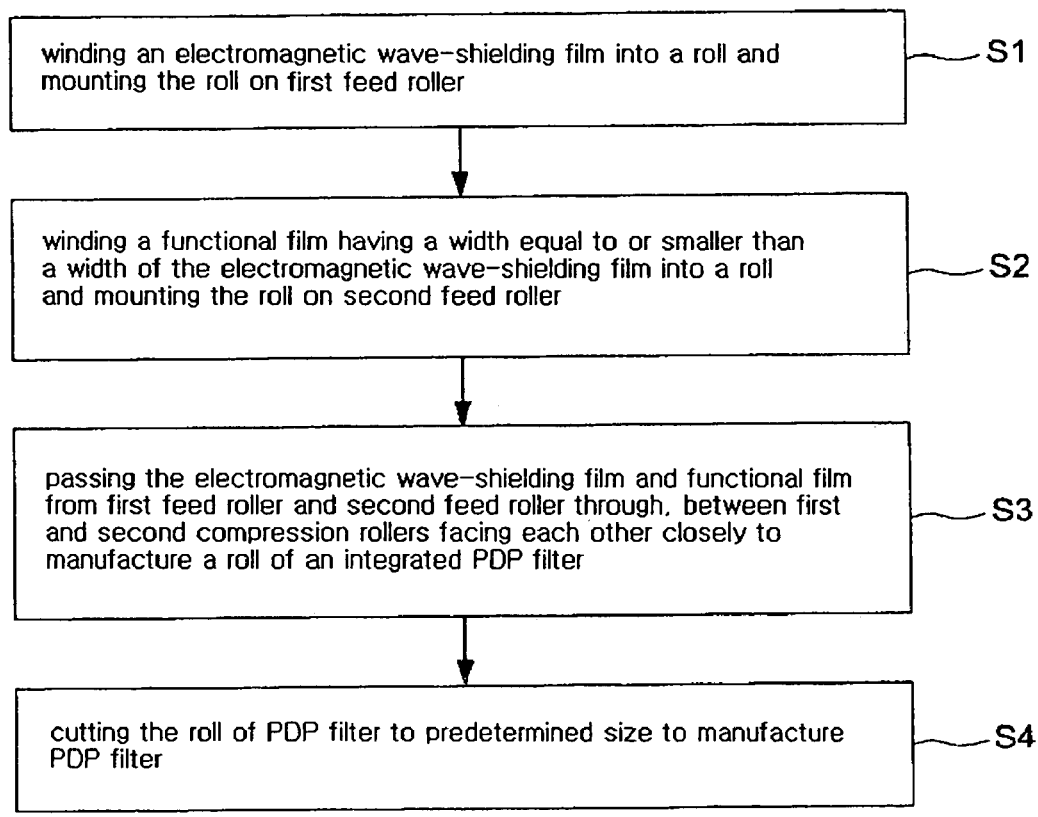
[Fig. 13]
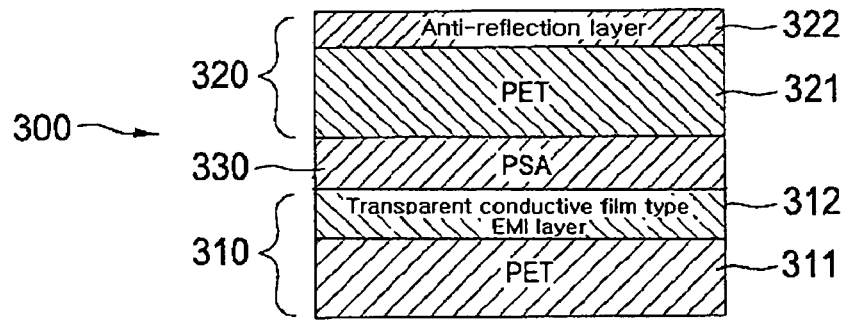
[Fig. 14]
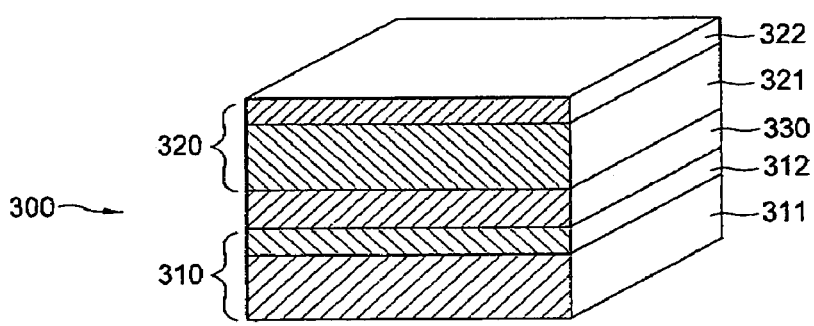

[Fig. 15]
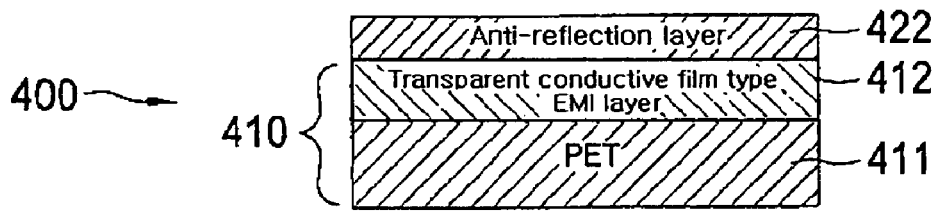
[Fig. 16]
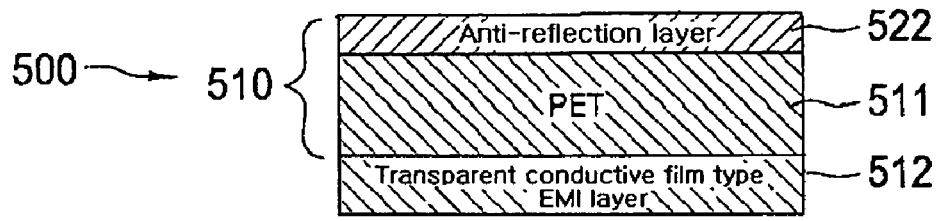
[Fig. 17]
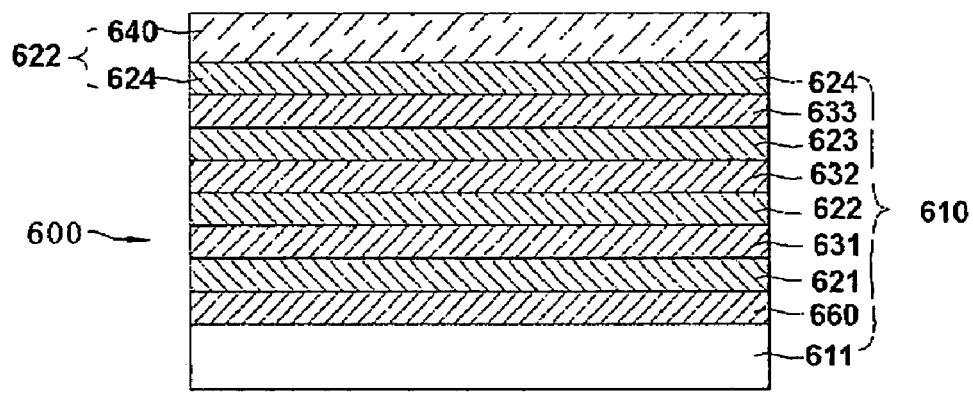
[Fig. 18]
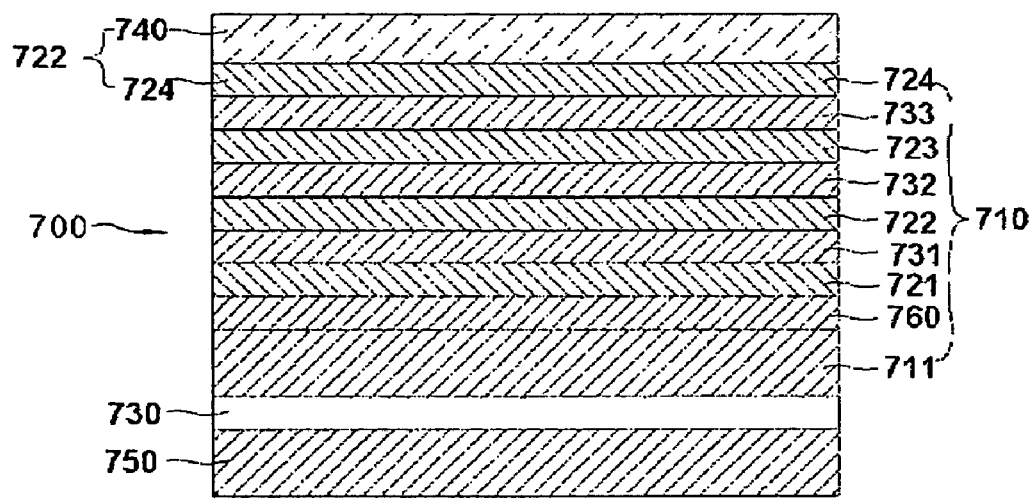

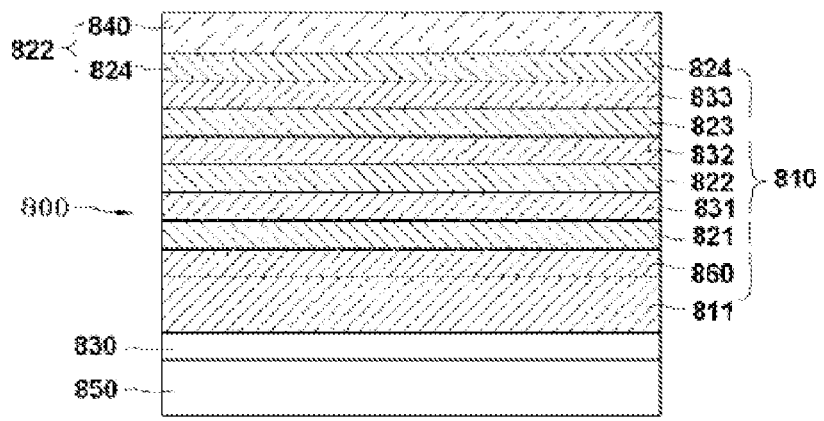
[Fig. 19]
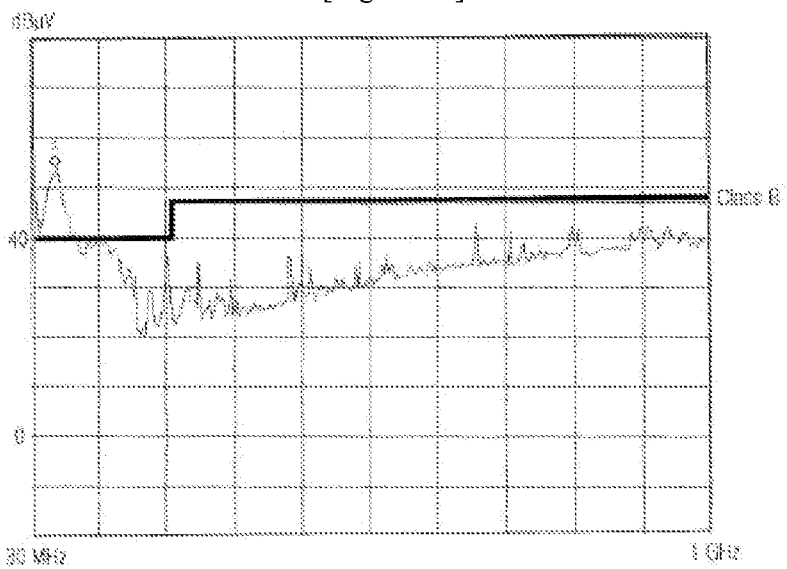
[Figure 20]
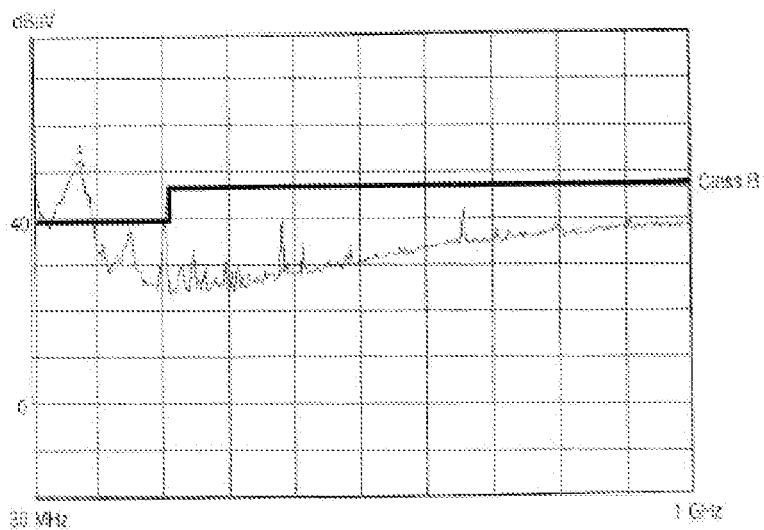
[Figure 21]

[Figure 22]
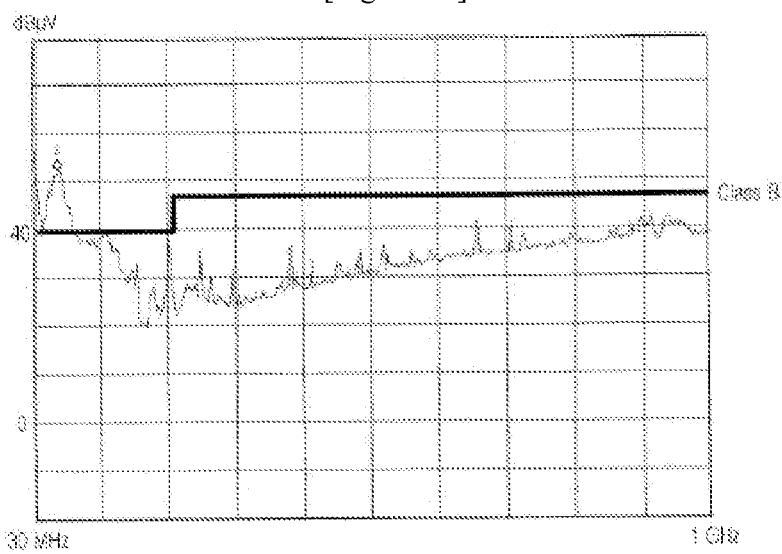
[Figure 23]
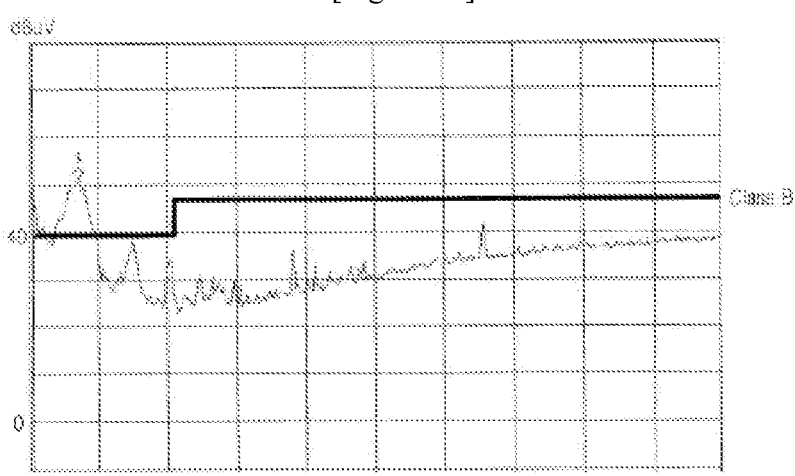
[Figure 24]
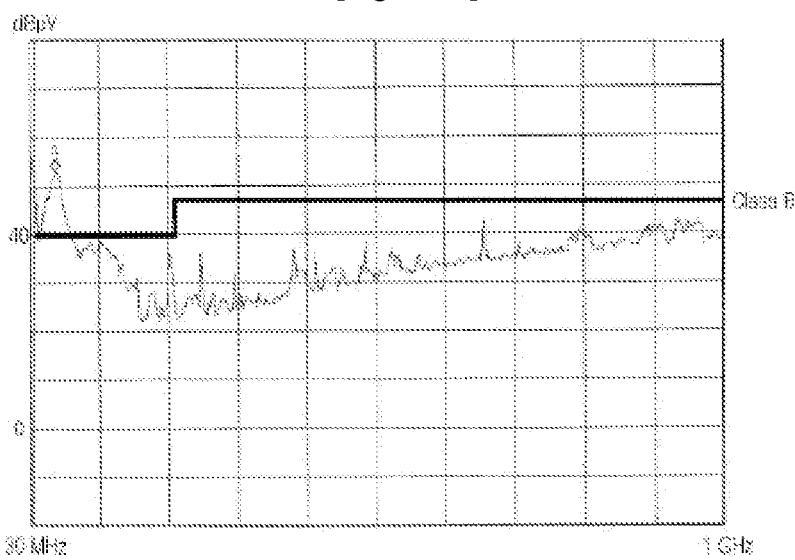

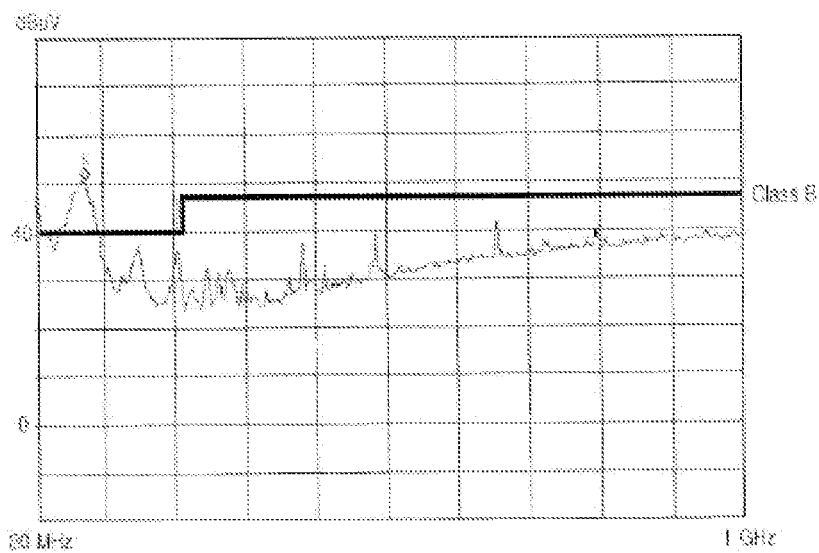
[Figure 25]

PDP FILTER AND MANUFACTURING METHOD THEREOF

This application claims priority to International Application No. PCT/KR2006/000749 filed on Mar. 3, 2006, Korean Patent Application No. 10-2005-0018294 filed on Mar. 4, 2005 and Korean Patent Application No. 10-2005-0032392 filed Apr. 19, 2005, all which are incorporated by reference, as if fully set forth herein.

TECHNICAL FIELD

The present invention relates to a PDP filter and a method of manufacturing the same. More particularly, the present invention relates to a PDP filter using a transparent conductive film type electromagnetic wave-shielding layer, in which at least two edge portions of the surface of the transparent conductive film type electromagnetic wave-shielding layer, which is in contact with other functional layers, are not exposed outside the laminated structure of the PDP filter, and to a method of manufacturing such a PDP filter. In addition, the present invention relates to a PDP filter comprising a single optical film having an electromagnetic wave-shielding function, a near infrared absorption function, and an anti-reflection function, formed on the basis that a transparent conductive film type electromagnetic wave-shielding layer need not be exposed, and to a method of manufacturing such a PDP filter.

BACKGROUND ART

Generally, a plasma display panel (PDP) is a device that displays an image including characters or graphics by emitting phosphor using UV light at 147 nm emitted upon electrical discharge of an inert gas mixture comprising He+Xe, Ne+Xe, or He+Ne+Xe, etc. Specifically, a PDP is a device causing self-luminescence due to an electrical discharge phenomenon in an electrical discharge cell that is formed in the shape of a matrix between an upper substrate having a scan electrode and a sustain electrode and a lower substrate having an address electrode.

The PDP is advantageous, because it can reproduce natural colors using self-luminescence, can assure a wide viewing angle of 160° or more, and can have a large screen, and is also receiving attention for use as a typical flat display device along with LCDs according to the recent trend toward decreased thickness and weight of a display device. However, the PDP suffers because it requires much higher power consumption than conventional CRT display devices, and thus electromagnetic waves and near infrared noise signals are more strongly emitted from the PDP set, compared to those of CRT display devices.

Electromagnetic waves, which affect the human body or other electronic apparatuses, need to be restricted to a predetermined level or less. Further, the near infrared noise signals occurring from the PDP may negatively affect the operation of wireless telephones or remote controllers. Therefore, the PDP requires a shielding structure different from that of the CRT display device as a structure for shielding electromagnetic waves or noise signals, realization of which is the most important technical task.

In order to efficiently shield such electromagnetic waves and near infrared noise signals from the PDP, as shown in the cross-sectional structure shown in FIG. 1, a PDP filter 20 is mounted over the entire surface of a PDP module 50 of a PDP 100. The PDP filter 20 is formed by aligning and attaching one or more functional layers to the upper surface or lower surface of a transparent substrate 22 made of acryl or reinforced glass or of the PDP module, as shown in the cross-sectional structures of FIGS. 2 to 7. The thick line of FIGS. 2 to 7 shows the portion that is silver printed or attached with conductive tape.

As the functional layers constituting the PDP filter 20, there is at least one film selected from the group consisting of an anti-reflection layer 21, an electromagnetic wave-shielding layer 23, a color control layer 24, and a near infrared shielding layer (not shown). The PDP filter 20 composed of such functional layers should be transparent since it is mounted to the front surface of the PDP 100.

The functional layers constituting the PDP filter 20 are laminated while variously changing the lamination sequence, as necessary, in order to exhibit inherent functions of respective layers. The functions of respective layers are as follows. The anti-reflection layer 21 functions to prevent reflection of external incident light to the outside in order to increase the contrast of the PDP 100. The electromagnetic wave-shielding layer 23 functions to shield electromagnetic interference (EMI) occurring in the PDP module 50, which is then grounded to the back cover of the PDP 100 for subsequent electrical discharge. The near infrared shielding layer (not shown) functions to shield near infrared rays at about 800~1000 nm emitted from the PDP module 50 to prevent the emission of near infrared rays of a predetermined level or more, so that signals, such as remote control signals, which are controlled using infrared rays at about 947 nm, are transferred normally. The color control layer 24 functions to control a specific color using included red (R), green (G) and blue (B) dyes. Moreover, since the electromagnetic wave-shielding layer 23 and the near infrared shielding layer (not shown) are based on a similar shielding principle, either one of the two layers may be formed so as to simultaneously exhibit two functions.

The PDP filter composed of respective functional layers is manufactured by cutting one or more functional layers to a predetermined size and then attaching them to each other, as necessary. As shown in the cross-sectional structures of FIGS. 2 to 7, the conventional PDP filter has unequal cross-sectional widths of the functional layers due to the presence of the electromagnetic wave-shielding layer 23.

The electromagnetic wave-shielding layer typically contained in the PDP filter is specifically described below. The electromagnetic wave-shielding layer may be classified into a metal mesh type and a transparent conductive film type, depending on the kind of film used. Although the PDP filter having a mesh type electromagnetic wave-shielding layer exhibits excellent electromagnetic wave-shielding effects, it reduces transparency and causes image distortion. Further, since the mesh itself is expensive, a product price is undesirably increased.

Hence, in order to substitute for mesh type, a PDP filter having a transparent conductive film type electromagnetic wave-shielding layer such as ITO layer has been widely used. The transparent conductive film type electromagnetic wave-shielding layer is in a multilayered thin film form, in which metal thin films and high-refractive transparent thin films are alternately applied, and preferably alternately applied three times or more, and a high-refractive transparent thin film is further applied as the uppermost layer. The metal thin film is formed of silver (Ag) or alloy composed mainly of silver, and has surface resistance of 3 Ω or less and visible light transmittance of 50% or more.

The structure of the PDP filter including the conventional transparent conductive film type electromagnetic wave-shielding film is shown in FIG. 8. The edge portion of the surface of the conventional transparent conductive film type electromagnetic wave-shielding film 70 has an exposed portion 71 for electrical grounding. The exposed portion 71 may be silver printed or attached with conductive tape in order to prevent an increase in resistance due to oxidation. The exposed portion 71 is connected with a filter supporter 30 through contact with a ground pin 170 to realize electrical grounding to the back cover, or may be directly grounded to the corresponding surface of the PDP, thereby grounding the electromagnetic waves.

That is, since the transparent conductive film type electromagnetic wave-shielding film 70 as one constituent of the PDP filter 20 should have the exposed portion 71 for grounding, other functional layers that are attached to the upper surface of the electromagnetic wave-shielding film 70 should be cut to be smaller than the electromagnetic wave-shielding film 70 so that the exposed portion 71 of the electromagnetic wave-shielding film 70 is exposed outside the laminated structure of the PDP filter. Thus, the conventional PDP filter has a limit in that the cross-sectional widths of the functional layers cannot be completely equal to each other, as shown in FIGS. 2 to 7.

Consequently, due to the cross-sectional structure of the PDP film mentioned above, each of the PDP filter is manufactured by aligning and attaching one by one the functional films, each smaller than the size of the transparent conductive film type electromagnetic wave-shielding film. However, such a manual process complicates manufacturing processes, and a roll-to-roll process (continuous manufacturing process) cannot be implemented, and thus mass production is impossible to realize, resulting in decreased productivity.

The anti-reflection film may be manufactured by forming the high-refractive transparent thin film and the low-refractive transparent thin film on the transparent substrate. That is, in the structure of the anti-reflection film, the low-refractive transparent thin film should be positioned as the uppermost layer, and the high-refractive transparent thin film should be positioned therebeneath.

With the intention of manufacturing a light and thin PDP in the related art, various attempts have been made to manufacture a PDP filter through integration of the transparent conductive film type electromagnetic wave-shielding film and the anti-reflection film into a multilayered structure using the transparent substrate in common. For example, Japanese Patent Laid-open Publication No. Hei. 11-74683 discloses a method of manufacturing a PDP filter comprising interposing an electromagnetic wave-shielding film between two transparent substrates, attaching an anti-reflection film to one surface of the resulting substrate, and sequentially laminating a near infrared shielding film and an anti-reflection film on the other surface of the resulting substrate. In addition, Japanese Patent Laid-open Publication No. Hei. 13-134198 discloses a method of manufacturing a PDP filter comprising sequentially attaching an electromagnetic wave-shielding film and an anti-reflection film to one surface of a transparent substrate, and then attaching a near infrared shielding film to the other surface of the transparent substrate.

The above conventional methods may realize relatively light weight and thinness. However, even though the laminated structure is formed using the transparent substrate in common, the conventional methods are disadvantageous because individual functional films should still be manufactured by separately forming the electromagnetic wave-shielding layer or anti-reflection layer on the transparent substrate. Further, limitations are imposed on further decreasing the number of processes of separately manufacturing respective functional films or the number of laminated layers.

DISCLOSURE OF INVENTION

Technical Problem

Leading to the present invention, the present inventors have continuously conducted experiments and research into conventional electromagnetic wave-shielding films and electromagnetic wave-shielding effects of PDP filters using the same, resulting in the finding that whether the conductive surface of a transparent conductive film type electromagnetic wave-shielding film is exposed or grounded does not affect the electromagnetic wave-shielding effects. Thus, an object of the present invention is to provide a PDP filter which can be formed into variously laminated structures and can be mass produced using a roll-to-roll manufacturing process, and a method of manufacturing such a PDP filter.

Another object of the present invention is to provide a multifunctional PDP filter having a simple structure by minimizing the number of functionally overlapping layers when laminating other functional layers on a transparent conductive film type electromagnetic wave-shielding film using a property in which the conductive surface of the transparent conductive film type electromagnetic wave-shielding film need not be exposed, and a method of manufacturing such a PDP filter.

Technical Solution

In order to achieve the above objects, the present invention provides a PDP filter, having a laminated structure comprising a transparent conductive film type electromagnetic wave-shielding layer and one or more other functional layers, in which at least two edge portions of a surface of the transparent conductive film type electromagnetic wave-shielding layer, which is in contact with the functional layer, are not exposed outside the laminated structure of the PDP filter.

In addition, the present invention provides a method of manufacturing a PDP filter, comprising winding a transparent conductive film type electromagnetic wave-shielding film into a roll and then mounting the roll of the transparent conductive film type electromagnetic wave-shielding film on a first feed roller; winding a functional film other than the transparent conductive film type electromagnetic wave-shielding film into a roll and then mounting the roll of the functional film on a second feed roller spaced apart from the first feed roller; providing a first compression roller and a second compression roller, which are disposed to face each other closely, at a position spaced apart from the first feed roller and second feed roller, and then passing the transparent conductive film type electromagnetic wave-shielding film from the first feed roller and the functional film from the second feed roller through, between the first compression roller and second compression roller, thus obtaining a film integrated by heat or pressure; and cutting the integrated film such that at least two edge portions of a surface of the transparent conductive film type electromagnetic wave-shielding film, which is in contact with the functional film, are not exposed.

In addition, the present invention provides a method of manufacturing a PDP filter, comprising forming one or more other functional layers on the upper surface, the lower surface or both surfaces of a transparent conductive film type electromagnetic wave-shielding layer using a coating process, in which the coating process is conducted so as not to expose at least two edge portions of the upper surface, the lower surface or both surfaces of a transparent conductive film type electromagnetic wave-shielding film.

In addition, the present invention provides a PDP filter, comprising a transparent substrate, a transparent conductive film type electromagnetic wave-shielding layer including high-refractive transparent thin film layers and metal thin film layers that are alternately laminated on the transparent substrate and a high-refractive transparent thin film layer provided on an uppermost surface of the alternately laminated layers, and a low-refractive transparent thin film layer formed on the uppermost high-refractive transparent thin film layer, in which at least two edge portions of a surface of the transparent conductive film type electromagnetic wave-shielding layer, which is in contact with the low-refractive transparent thin film layer, are not exposed.

In addition, the present invention provides a method of manufacturing a PDP filter, comprising alternately laminating high-refractive transparent thin film layers and metal thin film layers on a transparent substrate, and providing a high-refractive transparent thin film layer on an uppermost surface of the alternately laminated layers, thus forming a transparent conductive film type electromagnetic wave-shielding layer; and forming a low-refractive transparent thin film layer on the uppermost high-refractive transparent thin film layer, in which at least two edge portions of a surface of the transparent conductive film type electromagnetic wave-shielding layer, which is in contact with the low-refractive transparent thin film layer, are not exposed.

In addition, the present invention provides a PDP, comprising the PDP filter mentioned above. In the PDP according to the present invention, the transparent conductive film type electromagnetic wave-shielding layer of the PDP filter can be not electrically grounded.

Advantageous Effects

In the PDP filter of the present invention, even though the edge portions of the surface of the transparent conductive film type electromagnetic wave-shielding layer as one constituent thereof are not exposed and not grounded, an electromagnetic wave-shielding function equal to that of conventional PDP filters can be exhibited, thus realizing variously laminated structures of the PDP filter. Further, since the PDP filter may be formed into the laminated structure mentioned above, a continuous manufacturing process, such as a roll-to-roll process, may be applied upon manufacturing of the PDP filter, thus achieving mass production and high productivity of the PDP filter. Furthermore, since the transparent conductive film type electromagnetic wave-shielding layer need not be exposed, the functional layers, requiring a structure that is functionally the same as part of the structure of the transparent conductive film type electromagnetic wave-shielding layer, may be formed into a simple structure, thereby easily manufacturing a multifunctional PDP filter.

BRIEF DESCRIPTION OF THE DRAWINGS

FIG. 1 is a cross-sectional view schematically showing one side of a conventional PDP;

FIGS. 2 to 7 are cross-sectional views showing conventional PDP filters;

FIG. 8 is a partial perspective view showing a ground portion (exposed portion) of a conventional electromagnetic wave-shielding film;

FIG. 9 is a plan view showing the plan structure of a PDP filter according to a first embodiment of the present invention;

FIG. 10 is a cross-sectional view showing the cross-sectional structure of the PDP filter according to the first embodiment of the present invention;

FIG. 11 is a view showing the arrangement of rollers for use in manufacturing the PDP filter of the present invention;

FIG. 12 is a flowchart showing a process of manufacturing the PDP filter of the present invention;

FIG. 13 is a cross-sectional view showing the cross-sectional structure of a PDP filter according to a second embodiment of the present invention;

FIG. 14 is a perspective view simultaneously showing the plan structure and cross-sectional structure of the PDP filter according to the second embodiment of the present invention;

FIG. 15 is a cross-sectional view showing the cross-sectional structure of a PDP filter according to a third embodiment of the present invention;

FIG. 16 is a cross-sectional view showing the cross-sectional structure of a PDP filter according to a fourth embodiment of the present invention;

FIG. 17 is a cross-sectional view showing the cross-sectional structure of a PDP filter according to a fifth embodiment of the present invention;

FIG. 18 is a cross-sectional view showing the cross-sectional structure of a PDP filter according to a sixth embodiment of the present invention;

FIG. 19 is a cross-sectional view showing the cross-sectional structure of a PDP filter according to a seventh embodiment of the present invention;

FIG. 20 is a graph showing the result of an experiment for shielding electromagnetic waves that are perpendicular to the front surface of the PDP filter having no ground portion, according to the present invention (Example 1);

FIG. 21 is a graph showing the result of an experiment for shielding electromagnetic waves that are parallel to the front surface of the PDP filter having no ground portion, according to the present invention (Example 1);

FIG. 22 is a graph showing the result of an experiment for shielding electromagnetic waves that are perpendicular to a conventional PDP filter provided with a ground portion through silver printing (Comparative Example 1);

FIG. 23 is a graph showing the result of an experiment for shielding electromagnetic waves that are parallel to the conventional PDP filter provided with a ground portion through silver printing (Comparative Example 1);

FIG. 24 is a graph showing the result of an experiment for shielding electromagnetic waves that are perpendicular to a conventional electromagnetic wave-shielding layer provided with a ground portion using conductive tape (Comparative Example 2); and FIG. 25 is a graph showing the result of an experiment for shielding electromagnetic waves that are parallel to the conventional electromagnetic wave-shielding layer provided with a ground portion using conductive tape (Comparative Example 2).

DESCRIPTION OF THE REFERENCE NUMERALS IN THE DRAWINGS

10: front cover
20: PDP filter
21: anti-reflection layer
22: transparent substrate
23: electromagnetic wave-shielding layer
24: color control layer
30: filter supporter
50: PDP module
60: driving circuit
70: electromagnetic wave-shielding film
71: exposed portion of electromagnetic wave-shielding film
72: laminated region of other functional films
100: PDP
170: ground pin
200, 300, 400, 500, 600, 700, 800: PDP filter 210, 310, 410, 510, 610, 710, 810: transparent conductive film type electromagnetic wave-shielding film 220, 320: anti-reflection film 213, 216, 311, 321, 411, 511, 611, 711, 811, 850: transparent substrate 214, 312, 412, 512: transparent conductive film type electromagnetic wave-shielding layer 215, 330, 730, 830: adhesive layer (PSA)

217, 322, 422, 522, 622, 722, 822: anti-reflection layer 230, 240: winding roll

250: first feed roller

260: second feed roller

270: first compression roller

280: second compression roller

290: PDP filter 621, 622, 623, 624, 721, 722, 723, 724, 821, 822, 823, 824: high-refractive transparent thin film layer 631, 632, 633, 731, 732, 733, 831, 832, 833: metal thin film layer 640, 740, 840: low-refractive transparent thin film layer 750: color control layer 660, 760, 860: hard coating layer Hereinafter, a detailed description will be given of the present invention.

In the present invention, the term 'film' means an independent entity, and the term 'layer' means part of the independent entity. However, in the case where a functional film is included as one constituent of the PDP filter, it functions as a functional layer, and thus the above terms may be used interchangeably, and the scope of the present invention is not limited thereto.

The PDP filter of the present invention is characterized by having a laminated structure comprising a transparent conductive film type electromagnetic wave-shielding layer and one or more other functional layers, in which at least two edge portions of the surface of the transparent conductive film type electromagnetic wave-shielding layer, which is in contact with the other functional layers, are not exposed outside the laminated structure of the PDP filter.

Conventionally, it is known that when other functional layers are present on the transparent conductive film type electromagnetic wave-shielding film, all of the edge portions of the conductive surface of the transparent conductive film type electromagnetic wave-shielding film must be exposed to form a ground portion for electrical grounding, the ground portion should be printed with silver or attached with conductive tape to decrease the surface resistance of the ground portion, and the ground surface thus realized exhibits an electromagnetic wave-shielding effect only upon contact with a ground pin of a PDP case.

However, the present inventors have proven that the transparent conductive film type electromagnetic wave-shielding film can exhibit an electromagnetic wave-shielding effect through reflection even when not grounded upon application to a PDP and also the PDP filter of the present invention can manifest an electromagnetic wave-shielding effect similar to that of a conventional PDP filter even though the exposed portion of the transparent conductive film type electromagnetic wave-shielding layer is not formed and the transparent conductive film type electromagnetic wave-shielding layer is not grounded. Thus, in the PDP filter of the present invention, there is no need for the formation of the exposed portion for electrically grounding the transparent conductive film type electromagnetic wave-shielding layer, and there is also no need for the use of silver printing or conductive tape due to the absence of the exposed portion.

In the present invention, since the at least two edge portions of the surface of the transparent conductive film type electromagnetic wave-shielding layer, which is in contact with the other functional layers, are not exposed outside the laminated structure of the PDP filter, the laminated structure of the PDP filter may be variously formed. Hence, a PDP filter having a laminated structure without the need for exposure of the edge portions of the surface of the transparent conductive film type electromagnetic wave-shielding film can be manufactured using a roll-to-roll process, thus realizing mass production. Further, in the case where the PDP filter having the laminated structure is manufactured using a coating process, other functional layers may be formed over the entire surface of the transparent conductive film type electromagnetic wave-shielding film without the exposed portions, and thus the manufacturing process is simplified.

In the present invention, the transparent conductive film type. electromagnetic wave-shielding layer is formed by alternately laminating one or more high-refractive transparent thin film layers and one or more metal thin film layers and providing a high-refractive transparent thin film layer as the uppermost layer. The transparent conductive film type electromagnetic wave-shielding layer may be formed using processes and materials known in the art.

The high-refractive transparent thin film layer generally has a refractive index of 1.5 or more, and preferably 1.5~2 as known in the art, but the present invention is not limited thereto. The high-refractive transparent thin film layer is used as a barrier layer for preventing oxidation of the metal thin film layer by oxygen plasma created upon sputtering of the metal thin film layer, and may be formed of oxides, such as ITO, IZO, ATO, ZnO, ZnO—Al, $TiO_2$, $Nb_2O_3$ or SnO, or oxides of indium, titanium, zirconium, tin, zinc, antimony, tantalum, cerium, thorium, magnesium or potassium, each of which has relatively high resistance. In addition, in order to prevent the damage to the metal thin film layer by oxygen plasma in the course of formation of oxide, nitride such as $Si_3N_4$ may be provided as the barrier layer.

The metal thin film layer may be formed of at least one metal having relatively low resistance, and preferably metal having specific resistance of $3 \times 0^{-6}$ Ω·cm or less. Particularly, the metal thin film layer is formed using at least one metal such as gold, silver, copper, nickel, and aluminum.

Although the high-refractive transparent thin film layer and the metal thin film layer may be formed through, a sputtering process, the present invention is not limited thereto, and any process known in the art may be used. The electromagnetic wave-shielding film 210 having such a multilayered thin film structure may be manufactured in a manner. such that two or more films are repeatedly laminated or two or more films are attached to each other, thereby improving the electromagnetic wave-shielding effect.

In the present invention, the functional layer may be a film selected from the group consisting of an anti-reflection film, a near infrared absorbing film, and a color control film, or may be a film able to exhibit two or more functions among the functions of the above films. In the PDP filter of the present invention, the transparent conductive film type electromagnetic wave-shielding layer has a near infrared absorption function as well as an electromagnetic wave-shielding effect. However, the PDP filter of the present invention may further comprise a near infrared absorbing layer in order to achieve an excellent near infrared absorption function. The near infrared absorbing layer may be formed using processes and materials known in the art. The near infrared absorbing layer may be prepared by dissolving or dispersing a dye and/or inorganic pigment able to absorb near infrared rays in a polymer binder to obtain a solution which is then applied on the transparent substrate, or by adding it to the process of preparing an adhesive.

As the substrate required for the formation of the transparent conductive film type electromagnetic wave-shielding layer or other functional layers, a transparent substrate is used. Examples of the transparent substrate include reinforced or semi-reinforced glass or plastic films which are formed of polyester resin, methacrylate resin, fluorine resin, triacetate resin, or mixtures thereof. Although PET (Polyethylene terephthalate) or TAC (Triacetyl cellulose) is preferably used, the present invention is not limited thereto. The transparent substrate is about 30~150 μm thick, and preferably 70~120 μm thick, but the present invention is not limited thereto.

The lamination of the transparent conductive film type electromagnetic wave-shielding layer and the one or more other functional layers may be conducted through a film adhesion process. The adhesion process may be carried out using external heat or pressure or using an adhesive. Examples of the adhesive include rubber, acryl, silicone, etc. In particular, the acrylic adhesive, having various application properties making it suitable for use in the preparation of an adhesive composition having high functionality, has an alkyl group as a functional group, thereby preventing a change in color due to oxidation of the metal thin film layer of the electromagnetic wave-shielding film under high-temperature and high-humidity conditions.

Further, the films may be adhered by heat using a hot-melt resin. Furthermore, a multilayered structure may be formed into a single film by forming another functional layer on one layer using a thin film formation process, such as a coating process, for example, a wet coating process or deposition.

In the case of using the adhesive, an organic or inorganic pigment and/or organic or inorganic dye for color control may be added to the adhesive layer to provide a color control function. Examples of the organic or inorganic pigment and/or organic or inorganic dye for color control include titanium oxide (rutyl type), titanium oxide (anatase type), cadmium yellow, chrome yellow, molybdate orange, cadmium red, iron oxide, copper phthalocyanine green, copper phthalocyanine blue, carbon black, cobalt blue, cobalt bio red, mineral bio red, chromium oxide, thren blue, cadmi red, carbon 1, carbon 2, cadmi yellow, phthalocyanine blue, aniline black, azo pigments, azo dyes, azo compounds, azo basic oxide, basic pigments, metal complex salts, azo methine pigments, pigments containing metal and metal oxide, aniline formaldehyde resin, aryl group, arylated resin, etc. Examples of the metal and metal oxide include $Nd_2O_3$, Nd-based Fe and iron oxide, Ag and silver oxide, Ni and nickel oxide, Cr and chromium oxide, other metals and oxides thereof.

In the PDP filter, the width of the transparent conductive film type electromagnetic wave-shielding layer and the width of the other functional films laminated on the transparent conductive film type electromagnetic wave-shielding layer may be variously selected within a range that does not expose at least two edge portions of the transparent conductive film type electromagnetic wave-shielding layer. For example, the transverse or longitudinal width of the other functional film may be greater than that of the transparent conductive film type electromagnetic wave-shielding layer. In addition, either the transverse width or longitudinal width of the other functional film may be equal to or smaller than that of the transparent conductive film type electromagnetic wave-shielding layer.

Preferably, the PDP film of the present invention may have a structure in which the transparent conductive film type electromagnetic wave-shielding layer and the anti-reflection layer are laminated on the transparent substrate. Particularly, the PDP film may be formed by. laminating the transparent conductive film type electromagnetic wave-shielding layer on the transparent substrate, and then laminating the anti-reflection layer on the transparent conductive film type electromagnetic wave-shielding layer. In addition, the PDP film may have a structure in which the transparent conductive film type electromagnetic wave-shielding layer and the anti-reflection layer are laminated on respective surfaces of the transparent substrate. The anti-reflection layer is preferably disposed on the outer surface to which external light is applied upon application of the PDP filter to a PDP. The anti-reflection film or anti-reflection layer is positioned on the foremost surface of the PDP filter so as to prevent reflection of external incident light, thus increasing contrast.

According to a preferred embodiment of the present invention, in a PDP filter having a laminated structure comprising a transparent conductive film type electromagnetic wave-shielding layer and one or more other functional layers, none of the four edge portions of the surface of the transparent conductive film type electromagnetic wave-shielding layer, which is in contact with the other functional layers, may be exposed.

Further, the present invention provides a method of manufacturing the PDP filter, comprising winding a transparent conductive film type electromagnetic wave-shielding film into a roll and then mounting the roll of the transparent conductive film type electromagnetic wave-shielding film on a first feed roller; winding a functional film other than the transparent conductive film type electromagnetic wave-shielding film into a roll and then mounting the roll of the functional film on a second feed roller which is spaced apart from the first feed roller; and providing a first compression roller and a second compression roller disposed to face each other closely at a position that is spaced apart from the first feed roller and second feed roller and then passing the transparent conductive film type electromagnetic wave-shielding film from the first feed roller and the functional film from the second feed roller through, between the first compression roller and second compression roller, thus obtaining a film integrated by heat or pressure; and cutting the integrated film such that at least two edge portions of the surface of the transparent conductive film type electromagnetic wave-shielding film, which is in contact with the functional film, are not externally exposed.

In the PDP filter manufactured by the above method, the roll film obtained through a roll-to-roll process is cut to a desired size, and thus, among four edge portions of the surface of the transparent conductive film type electromagnetic wave-shielding layer, the two edge portions corresponding to the cut portions are not exposed outside the laminated structure of the PDP filter.

The edge portions of the surface of the transparent conductive film type electromagnetic wave-shielding film may be exposed or unexposed, depending on the positions of the other functional films to be laminated on the electromagnetic wave shielding film. Thus, the widths of the functional films are not particularly limited. In the present invention, the width of the transparent conductive film type electromagnetic wave-shielding film is equal to or greater than that of the functional film.

In addition, the present invention provides a PDP filter comprising a transparent substrate, a transparent conductive film type electromagnetic wave-shielding layer including high-refractive transparent thin film layers and metal thin film layers alternately laminated on the transparent substrate and a high-refractive transparent thin film layer provided on the uppermost surface of the alternately laminated layers, and a low-refractive transparent thin film layer disposed on the uppermost high-refractive transparent thin film layer, in which at least two edge portions of the surface of the transparent conductive film type electromagnetic wave-shielding layer, which is in contact with the low-refractive transparent thin film layer, are not externally exposed, and provides a method of manufacturing such a PDP filter.

In the present invention, the low-refractive transparent thin film layer is formed on the transparent conductive film type electromagnetic wave-shielding layer, based on a property enabling the transparent conductive film type electromagnetic wave-shielding layer to exhibit the electromagnetic wave shielding effect even though it is not exposed and not grounded. The low-refractive transparent thin film layer may function as an anti-reflection layer, along with the uppermost high-refractive transparent thin film layer of the transparent conductive film type electromagnetic wave-shielding layer. Therefore, the low-refractive transparent thin film layer may be formed alone on the transparent conductive film type electromagnetic wave-shielding layer without the use of an additional anti-reflection film, thereby manifesting both anti-reflection function as well as the electromagnetic wave-shielding function and the near infrared absorption function. Thus, the PDP filter of the present invention may be manufactured to be light and thin, and the manufacturing process thereof may be further simplified.

The low-refractive transparent thin film layer generally has a refractive index less than 1.45, and preferably 1.2~1.45 as known in the art, but the present invention is not limited thereto. The low-refractive transparent thin film layer is formed by sputtering or vacuum depositing a low-refractive inorganic layer such as $SiO_2$ or $MgF_2$ or by applying a fluorinated polymer film or a copolymer comprising a fluorine-based low-refractive monomer and an acrylic monomer having good coatability using wet coating such as micro gravure coating or dip coating.

In the present invention, the PDP filter may further include a hard coating layer between the transparent substrate and the lowermost high-refractive transparent thin film layer in order to increase scratch resistance and surface hardness. The hard coating layer may be typically formed in a radiation curing type or a silane type. In particular, a radiation curing type hard coating layer is preferable, and a UV curing type hard coating layer is more preferable. The UV curing type composition used for the formation of the hard coating layer includes UV curable compositions formed of urethane-acrylate, epoxy-acrylate, polyester-acrylate, etc.

The hard coating layer may be formed by applying a composition for a hard coating layer on a transparent substrate and then curing the composition through heat or radiation (e.g., UV light), but the present invention is not limited thereto and a typical process known in the art may be used. The thickness of the hard coating layer is not particularly limited but is preferably about 1~5 μm.

In the present invention, the PDP filter may further include a color control layer on the other surface of the transparent substrate on which the electromagnetic wave-shielding layer is formed. The color control layer may be formed by integrating a separately prepared color control film with the electromagnetic wave-shielding film using a roll-to-roll process. The integrating process may be carried out using an adhesive. Alternatively, when an adhesive layer is formed on the other surface of the transparent substrate on which the electromagnetic wave-shielding layer is formed, the organic or inorganic pigment and/or organic or inorganic dye for color control may be added to the adhesive layer, thereby forming the color control layer.

Although the PDP filter of the present invention is not limited with respect to thickness, it may be about 3 mm thick when including reinforced glass.

The present invention provides a PDP comprising the PDP filter. The PDP of the present invention may exhibit an electromagnetic wave-shielding function even though the transparent conductive film type electromagnetic wave-shielding layer of the PDP filter is not grounded.

Below, the preferred embodiments of the present invention are described with reference to the appended drawings, but the following drawings and description are intended to illustrate the present invention and are not intended to define the scope of the present invention.

FIG. 9 is a plan view showing the plan structure of a PDP filter according to a first embodiment of the present invention, and FIG. 10 is a cross-sectional view showing the cross-sectional structure of the PDP filter of FIG. 9.

According to the first embodiment of the present invention shown in FIG. 9, a film type PDP filter 200 is provided. The film type PDP filter may be attached to a transparent substrate 22 formed of s transparent material such as glass for application to a PDP, or may be directly attached to a PDP module 50 for application to a PDP. A transparent conductive film type electromagnetic wave-shielding film 210 constituting pal of the PDP filter 200 of FIG. 9 is structured in a manner such that both left and right edge portions 211, 212 of the surface thereof are exposed, and both upper and lower edge portions thereof are covered with an anti-reflection film 220 disposed thereon, and thus are not exposed. The PDP filter 200 according to the first embodiment may be manufactured through a roll-to-roll process due to the above structure.

As in the cross-sectional structure of FIG. 10, an electromagnetic wave-shielding layer 214 is disposed on an about 100 μm-thick transparent polymer resin film 213 such as PET film. As such, the transparent conductive film type electromagnetic wave-shielding layer 214 and the transparent polymer resin film 213 are referred to as the transparent conductive film type electromagnetic wave-shielding film 210. The transparent conductive film type electromagnetic wave-shielding layer 214 is a multilayered thin film structure comprising one or more high-refractive transparent thin film layers and one or more metal thin film layers alternately laminated. Such a multilayered thin film may be formed using a sputtering process.

The transparent conductive film type electromagnetic wave-shielding film 210 of FIG. 9 or 10 need not be exposed outside the PDP filter, and thus it does not require a conventional silver printing process or the use of conductive tape. As for the transparent conductive film type electromagnetic wave-shielding film 210 of the present invention, the entire region of the unexposed surface may be formed into an effective screen portion.

The PDP filter 200 of FIGS. 9 and 10 has the anti-reflection film 220 provided at a position that is the closest to the side from which a user views a PDP, that is, on the outermost surface of the filter to which external light is applied.

To the PDP filter 200 of FIGS. 9 and 10, a color control film (not shown) may be additionally attached through a roll-to-roll process. In the case where the anti-reflection film 220 and the electromagnetic wave-shielding film 210 adhere to each other using a PSA (Pressure Sensitive Adhesive) layer 215 as an adhesive layer, R, G, B color control dyes are added to the adhesive layer such that the adhesive layer may function as the color control layer. However, the color control layer is not formed only on the position shown in the drawing, and may be formed on any position, as necessary.

The PDP filter thus manufactured may be attached to glass and thus manufactured into a glass type filter, or may be directly attached to a PDP module to be used as a film type PDP filter.

The method of manufacturing the PDP filter 200 of FIGS. 9 and 10 is described through the arrangement of rollers of FIG. 11 and a flowchart of FIG. 12.

The transparent conductive film type electromagnetic wave-shielding film 210 is wound into a roll and then such a wound roll 230 is mounted on a first feed roller 250 (step S1). Separately, the functional film, for example, the anti-reflection film 220, is wound into a roll, and then such a wound roll 240 is mounted on a second feed roller 260, which is spaced apart from the first feed roller 250 (step S2). As such, the width of the functional film is preferably equal to or smaller than that of the transparent conductive film type electromagnetic wave-shielding film 210. In the PDP filter according to the first embodiment, the width of the transparent conductive film type electromagnetic wave-shielding film is greater than that of the anti-reflection film, and the anti-reflection film is disposed at the center of the electromagnetic wave-shielding film. such that the two edge portions of the electromagnetic wave-shielding film are exposed.

Then, a first compression roller 270 and a second compression roller 280, which are disposed to face each other closely, are mounted at a position that is spaced apart from the first feed roller 250 and second feed roller 260. Subsequently, the transparent conductive film type electromagnetic wave-shielding film 210 from the first feed roller 250 and the anti-reflection film 220 from the second feed roller 260 are passed through, between the first compression roller 270 and second compression roller 280 so as to integrate them by heat or pressure, thus manufacturing a film (step S3). A PDP filter 290 integrated through steps S1 to S3 is manufactured into a wound roll, after which the PDP filter 290 is cut to a predetermined size, thereby completing a film type PDP filter before attaching it to glass or a PDP module (step S4). In such a case, the edge portions of the transparent conductive film type electromagnetic wave-shielding film corresponding to the cut film portions are covered with a functional film, such as the anti-reflection film, and are thus not externally exposed.

In the roll-to-roll process including the above steps, the integration of the two films 210, 220 may be realized by fusion using external heat through the first compression roller 270 and second compression roller 280, or by pressure of the first compression roller 270 and second compression roller 280. The external heat may be applied through at least one of the first compression roller and second compression roller.

In addition, a pressure sensitive adhesive is previously applied on inner surfaces of the two films 210, 220, which are fed into the first and second compression rollers 270, 280, after which pressure is applied through the first compression roller 270 and second compression roller 280, thereby integrating the two films 210, 220. In this way, when using the pressure sensitive adhesive, the adhesive layer 215 is formed as shown in FIG. 10.

In addition, the integration of the two films may be realized using a hot-melt resin. Specifically, the hot-melt resin is previously applied on portions at which the functional films comes into contact with each other. When the functional films are fed into the compression rollers, heat is applied through at least one of the first compression roller 270 and the second compression roller 280, therefore integrating the films while melting the hot-melt resin. Such a hot melt resin is typically exemplified by EVA (Ethylene Vinyl Acetate) resin, but the present invention is not limited thereto. As the hot-melt resin, any polymer resin may be used so long as it can maintain stable adhesion state of respective functional films including the transparent conductive film type electromagnetic wave-shielding film. In order to use the hot-melt resin, it is preferred that the temperature of at least one of the first compression roller 270 and the second compression roller 280 be maintained at 100~200° C. upon heat compression.

FIG. 13 is a cross-sectional view showing the cross-sectional structure of a preferred second embodiment of the PDP. filter 200, and FIG. 14 is a perspective view simultaneously showing the plan and side structures of the PDP filter according to the second embodiment.

As shown in FIGS. 13 and 14, the PDP filter 300 according to the second embodiment is characterized in that the sizes of functional layers constituting the PDP filter 300 are formed to have the same size, and none of the four edge portions of the surface of a transparent conductive film type electromagnetic wave-shielding film 310, which is in contact with other functional films, are exposed. From the point of view of the present invention in which at least two edge portions of a transparent conductive film type electromagnetic wave-shielding film are not exposed outside the laminated structure of a PDP film, the electromagnetic wave-shielding film is minimally exposed in the second embodiment.

According to the second embodiment of the present invention, shown in FIGS. 13 and 14, the transparent conductive film type electromagnetic wave-shielding film 310 and an anti-reflection film 320 are formed at exactly the same size, and thus the entire surface thereof may function as an effective screen portion. The PDP filter 300 of the second embodiment is composed of the anti-reflection film 320 including an about 100 μm-thick PET 321 and an AR (Anti-Reflection) layer applied thereon, the transparent conductive film type electromagnetic wave-shielding film 310 including an about 100 μm-thick PET 311 and a transparent conductive film type electromagnetic wave-shielding layer 312 disposed thereon, and a PSA layer 330 as an adhesive layer formed therebetween, like the first embodiment shown in FIGS. 9 and 10. The transparent conductive film type electromagnetic wave-shielding layer 312 may be formed through a sputtering process.

In the second embodiment, the two films may be integrated by heat fusion of hot-melt resin, instead of using the PSA layer sensitive to a predetermined pressure to realize adhesion, as described in the first embodiment.

Further, in the second embodiment of FIGS. 13 and 14, a color control layer may be formed by additionally attaching a color control film, or by adding R, G, B dyes to the PSA layer 330 for adhesion of the two films, like the first embodiment of FIGS. 9 and 10.

The PDP filter of the second embodiment may be manufactured using a roll-to-roll process as in the first embodiment, with the exception that the width of the electromagnetic wave-shielding layer is equal to that of the anti-reflection layer so as not to expose the edge portions of the surface of the electromagnetic wave-shielding film.

FIG. 15 is a cross-sectional view showing a PDP filter according to a third embodiment of the present invention. In the first and second embodiments, the anti-reflection film and transparent conductive film type electromagnetic wave-shielding film are attached using a roll-to-roll process to manufacture the PDP filter, and in the third embodiment, the uppermost surface of the transparent conductive film type electromagnetic wave-shielding film is coated with the anti-reflection layer, thereby manufacturing a single film type PDP filter.

The anti-reflection layer according to the third embodiment may be formed by alternately laminating high-refractive inorganic layers such as ITO (Indium Tin Oxide), $TiO_2$, or $ZrO_2$ layer and low-refractive inorganic layers such as $SiO_2$ or $MgF_2$ layer, preferably into 4 layers or more, using a sputtering or vacuum deposition process, or by forming a low-refractive fluorinated polymer film through a wet coating process, thereby forming the anti-reflection layer. In addition, high-refractive material, composed mainly of ITO, is applied on a substrate through vacuum deposition or sputtering, after which low-refractive material, composed mainly of fluorine-based resin, is applied on the high-refractive material layer through wet coating, thus forming the anti-reflection layer. However, the present invention is not limited to the above-mentioned processes of forming the anti-reflection layer. Upon wet coating, a process of adding particles to the coating composition to improve an anti-reflection function by scattering light may be used.

In the present invention, the edge portions of the transparent conductive film type electromagnetic wave-shielding film need not be exposed. Thus, in the case where an anti-reflection film is formed on a transparent conductive film type electromagnetic wave-shielding film 410 through the coating process as in the third embodiment, the entire upper surface of the electromagnetic wave-shielding film 410 may be uniformly coated regardless of whichever section. The above process may be adopted in the present invention, and therefore, the process of forming an anti-reflection layer 422 on the transparent conductive film type electromagnetic wave-shielding film 410 may be more easily and simply performed, compared to conventional techniques. Further, the number of processes may be greatly decreased.

FIG. 16 is a cross-sectional view showing a PDP filter according to a fourth embodiment of the present invention. Although the PDP filter according to the third embodiment is manufactured by forming the anti-reflection layer 422 on the transparent conductive film type electromagnetic wave-shielding film 410 through the coating process, in the fourth embodiment, a single transparent substrate 511 is used in common, and an anti-reflection layer 522 and a transparent conductive film type electromagnetic wave-shielding layer 512 are formed on the upper surface and lower surface of the substrate, respectively.

The PDP filter of the fourth embodiment may be manufactured by forming the anti-reflection layer 522 and the transparent conductive film type electromagnetic wave-shielding layer 512 on the upper and lower surfaces, respectively, of the transparent substrate 511. That is, the PDP filter of the fourth embodiment is manufactured in a manner such that the transparent conductive film type electromagnetic wave-shielding layer 512 is formed on the transparent substrate 511 to prepare the transparent conductive film type electromagnetic wave-shielding film 510, after which the transparent conductive film type electromagnetic wave-shielding film is inverted and the anti-reflection layer 522 is applied on the other surface of the transparent substrate. In the fourth embodiment, materials for the transparent substrate, materials for the transparent conductive film type electromagnetic wave-shielding film and anti-reflection layer, formation processes thereof, and addition of a color control function remain the same as in the above-mentioned embodiments.

In the present invention, the edge portions of the transparent conductive film type electromagnetic wave-shielding film need not be exposed. Thus, in the fourth embodiment, the entire surface of the transparent conductive film type electromagnetic wave-shielding film 510 may be uniformly coated with the anti-reflection layer 522 regardless of whichever section, as in the third embodiment. Thereby, the coating process for formation of the anti-reflection layer 522 may be easily conducted. Further, the use of such a coating process results in a simplified structure of the PDP filter 500, a much simpler manufacturing process thereof, a shortened manufacturing time, and a low manufacturing cost.

FIG. 17 is a cross-sectional view showing a PDP filter according to a fifth embodiment of the present invention. FIG. 17 shows the structure in which a low-refractive transparent thin film layer 640 is further laminated on an uppermost high-refractive transparent thin film layer 624 of a transparent conductive film type electromagnetic wave-shielding film 610.

In the transparent conductive film type electromagnetic wave-shielding film 610 according to the fifth embodiment, a hard coating layer 660 is first formed on a transparent substrate 611 to improve scratch resistance and surface hardness.

On the hard coating layer 660 formed on the transparent substrate 611, high-refractive transparent thin film layers 621, 622, 623, formed of ITO, SnO, etc., and metal thin film layers 631, 632, 633, formed of metal having a relatively low refractive index such as gold, silver, copper, nickel, or aluminum, are alternately laminated, after which the high-refractive transparent thin film layer 624 is further laminated as the uppermost layer.

As the transparent substrate 611, a plastic substrate having a thickness of 30~150 μm, and preferably 70~120 μm, is used. The film used in the plastic substrate is formed of polyester resin, methacrylate resin, fluorine-based resin, tri-acetate resin, or mixtures thereof. In particular, when the transparent substrate is attached to a faceplate such as glass plate, polyethylene terephthalate or polyethylene naphthalate may be preferably used.

The metal thin film layers 631, 632, 633 may be formed by using silver or silver alloy as a main target, argon (vacuum of 0.3 pa) as sputtering gas, and oxygen as reactive gas, in which the amount of argon is about 200 sccm, and the amount of oxygen is about 120 sccm. In the case where each of the metal thin film layers 631, 632, 633 is deposited to be thinner than 9 nm, it may break due to the coagulation of silver particles, and thus, it is preferably formed to have a thickness of 9 nm or more, and preferably about 10~20 nm.

The high-refractive transparent thin film layers 621, 622, 623, 624 are laminated to be used as the barrier layer for the prevention of oxidation of respective metal thin film layers by oxygen plasma created upon sputtering of the metal thin film layers 631, 632, 633. The high-refractive transparent thin film layer is formed of oxides, such as ITO, IZO, ATO, ZnO, ZnO—Al, $TiO_2$, or $Nb_2O_3$, or oxides of indium, titanium, zirconium, tin, zinc, antimony, tantalum, cerium, thorium, magnesium, or potassium. In the course of forming the oxide, nitride such as $Si_3N_4$ may be provided as the barrier layer in order to prevent damage to the metal thin film layer by oxygen plasma.

According to the fifth embodiment shown in FIG. 17, the number of high-refractive transparent thin film layers and metal thin film layers is 7, in addition to the transparent substrate 611 and the hard coating layer 660. However, the number of high-refractive transparent thin film layers and metal thin film layers is not limited to 7, and may be less than 7 or more than 7 so long as the PDP filter has surface resistance satisfying the requirements of Class A (surface resistance of 2.5 Ω or less) as an industrial safety standard or Class B (surface resistance of 1.5 Ω or less) as a home safety standard required in all countries.

On the uppermost surface of the laminated structure constituting the transparent conductive film type electromagnetic wave-shielding film 610, the high-refractive transparent thin film layer 624 must be disposed as the barrier layer in order to prevent oxidation of the metal thin film layer. This is because the uppermost high-refractive transparent thin film layer 624 constitutes the anti-reflection layer 622 along with the low-refractive transparent thin film layer 640 laminated thereon.

The low-refractive transparent thin film layer 640 may be formed by sputtering or vacuum depositing a low-refractive inorganic layer made of $SiO_2$, $MgF_2$, etc or by applying a fluorinated polymer film or a copolymer comprising a fluorine-based low-refractive monomer and an acrylic monomer having good coatability using wet coating such as micro gravure coating or dip coating.

For wet coating of the low-refractive transparent thin film layer 640, a process of synthesizing the fluorine-based low-refractive monomer is exemplified as follows.

1.0~1.2 mol of glycidyl methacrylate is added with 1.0~1.5 mol of a fluorine-contained compound, such as hexafluoropropanol or hexafluorobutanol, and a tetrahydrofuran solvent, refluxed at a predetermined temperature for a predetermined period of time in the presence of a tetrabutylammoniumfluoride (TBAF) catalyst, and then poured into methanol to recover the monomer. The resultant reaction yield generally is 90%.

Since the fluorine-based low-refractive monomer used alone has disadvantages, such as low adhesion, low solubility in an organic solvent, and poor coating properties, it is preferably copolymerized with the acrylic monomer for coatability. Examples of the acrylic monomer include typical acrylic monomers, for example, methyl methacrylate, ethyl methacrylate, isobutyl methaclylate, n-butyl methacrylate, n-butylmethyl methacrylate, acrylic acid, methacrylic acid, hydroxyacrylate, acrylamide, or methylolacrylate. The copolymerization ratio of fluorine-based low-refractive monomer to acrylic monomer is preferably 9:1~7:3.

If the copolymerization ratio exceeds 9:1, the amount of the fluorine-based low-refractive monomer is increased, and therefore the refractive index of the copolymer is very low and coating properties are deteriorated. On the other hand, if the ratio is less than 7:3, coatability, hardness and solubility in a solvent are good by virtue of the high ratio of the acrylic monomer, but desired anti-reflection effects cannot be obtained due to the refractive index of 1.45 or more.

The polymerization of the fluorine-based low-refractive monomer and the acrylic monomer is realized by general radical polymerization, and preferably by thermal polymerization using tetrahydrofuran as a solvent. The initiator is preferably used in an amount of 1~10 parts by weight, based on 100 parts by weight of the polymerizable monomer. The refractive index of the resulting polymer is generally 1.40 or less. The thickness of the resulting low-refractive transparent thin film layer is 200 nm or less, and preferably 70~150 nm to assure light transmission properties.

The coating solution for the formation of the low-refractive transparent thin film layer may be diluted with a general organic solvent, such as toluene, xylene, methylethylketone, methylisobutylketone, etc. The diluted solution preferably has a solid content of about 10% or less, and more preferably a solid content of 0.1~5%. If the solid content is less than 0.1%, it is impossible to form the coating film itself and thus the uniform coating layer is difficult to form. On the other hand, if the solid content exceeds 5%, the coating film is difficult to form to a thickness of hundreds of nm using any coating process known in the art.

The low-refractive transparent thin film layer 640 thus formed may function as an anti-reflection layer 622 along with the high-refractive transparent thin film layer 624 formed therebeneath. That is, the PDP filter 600 of the present invention may exhibit an anti-reflection function, as well as an electromagnetic wave-shielding function, by attaching only a layer other than the functionally overlapping layers without the additional attachment of an anti-reflection film. Hence, the laminated structure of the PDP filter is formed to be lighter and thinner, and the manufacturing process thereof may be further simplified.

The PDP filter according to the fifth embodiment of the present invention may be integrated with an additional functional layer using a roll-to-roll process.

FIG. 18 is a cross-sectional view showing a PDP filter according to a sixth embodiment of the present invention. The PDP filter of FIG. 18 is formed by attaching a color control film 750 to the lower surface of the PDP filter 610 according to the fifth embodiment of FIG. 17 using a roll-to-roll process, and thus functionally comprises an anti-reflection layer 722, a transparent conductive film type electromagnetic wave-shielding film 710, and the color control film 750, in that order from the upper side. Further, an adhesive layer 730 is provided between the electromagnetic wave-shielding film 710 and the color control film 750 for adhesion of the two films.

The color control film 750 may be formed by laminating a polymer material comprising an organic or inorganic pigment and/or an organic or inorganic dye having a color control function in a form of a film on a transparent substrate (not shown), or may be formed using a coating material.

The adhesive layer 730 is formed with the adhesive previously applied on the inner surfaces of the two films 710, 750 so as to be adhered together by external pressure or heat upon integration of the two films 710, 750 in a roll-to-roll process. As such, examples of the adhesive generally include rubber, acryl, silicone, etc. In particular, in the acrylic adhesive having various application properties making it suitable for use in the preparation of an adhesive composition having high functionality, an alkyl group is used as the functional group thereof, thereby preventing a change in color due to oxidation of the metal thin film layer of the electromagnetic wave-shielding film under high-temperature and high-humidity conditions.

Specifically, the acrylic adhesive includes 100 parts by weight of an acrylic copolymer comprising 90~99.9 parts by weight of a (meth)acrylic acid ester monomer having a C1~C12 alkyl group and 0.1~10 parts by weight of a vinylic monomer having a hydroxyl group, and 0.01~10 parts by weight of a multifunctional isocyanate-based crosslinking agent. When the (meth)acrylic acid ester monomer having a C1~C12 alkyl group is used in an amount less than 90 parts by weight, based on 100 parts by weight of the acrylic copolymer, it suffers because initial adhesion properties are deteriorated and the cost is increased. Preferably, the above monomer is used in an amount of 94~99.9 parts by weight.

According to the sixth embodiment of FIG. 18, it is possible to roll-to-roll laminate the color control film 750 on the simplest integrated film structure to exhibit both the anti-reflection function and electromagnetic wave-shielding function. The PDP filter thus manufactured is a film type, and may be manufactured in semi-finished roll form without glass, and the semi-finished product may be laminated once to glass and thus finished.

FIG. 19 is a cross-sectional view showing a PDP filter according to a seventh embodiment of the present invention. In the PDP filter of FIG. 19, without the additional use of a color control film, a polymer material comprising an organic or inorganic pigment and/or an organic or inorganic dye having a color control function is added to an adhesive layer 830 that is required for attaching a film integrated into a single film capable of exhibiting both an anti-reflection function and an electromagnetic wave-shielding function on the entire surface of a transparent substrate 850, such as a glass substrate or a module, using an adhesive, thus forming a color control layer.

When adopting the PDP filter thus structured, the number of laminated layers of the PDP filter and of manufacturing processes is decreased.

MODE FOR THE INVENTION

A better understanding of the present invention may be obtained through the following examples which are set forth to illustrate, but are not to be construed as the limit of the present invention.

EXAMPLE 1

Onto a transparent conductive film type electromagnetic wave-shielding film [visible light transmittance: 60~65%, surface resistance: <1.8 Ω/□], available from Bekaert, an anti-reflection film (trade name: 7702UV), available from NOF Corp., Japan, was attached using a pressure sensitive adhesive. The integrated film thus manufactured was cut to a large size of 97 cm×56 cm, thus manufacturing a PDP filter in which the edge portions of the surface of the electromagnetic wave-shielding layer were not exposed.

Comparative Example 1

Onto the center of a transparent conductive film type electromagnetic wave-shielding film having a size of 100 cm×60 cm [visible light transmittance: 60~65%, surface resistance: <1.8 Ω/□], available from Bekaert, an anti-reflection film having a size of 92 cm×52 cm (trade name: 7702UV), available from NOF Corp., Japan, was attached using a pressure sensitive adhesive. In the PDP filter thus manufactured, all of the exposed edge portions of the electromagnetic wave-shielding film were silver printed to a width of 2 cm using a screen printing process (silver paste: 479SS available from Acheson).

Comparative Example 2

A PDP filter was manufactured in the same manner as in Comparative Example 1, with the exception that all of the exposed edge portions of the electromagnetic wave-shielding film were attached with 2 cm wide conductive tape (DK-102 available from AMIC), instead of using the silver printing process.

[Electromagnetic Wave-Shielding Experiment]

An experiment for determining shielding of electromagnetic waves perpendicular to or parallel to the front surface of each of the PDP filters manufactured in Example 1 and Comparative Examples 1 and 2 was performed. The results for Example 1 are given in FIGS. 20 and 21, the results for Comparative Example 1 are given in FIGS. 22 and 23, and the results for Comparative Example 2 are given in FIGS. 24 and 25.

For reference, the electromagnetic waves are strongly electrically conducted by a conductor such as a power line or a signal line when the frequency is decreased, whereas they are strongly radiated into space when the frequency is increased. Hence, the level of inhibition of the radiation of electromagnetic wave noise of a PDP having an electromagnetic wave range of 30 MHz or more was measured.

The measurement of the electromagnetic waves was carried out in a semi-anechoic chamber in which all of wall surfaces other than the bottom surface were made of wave absorbing material and metal plates. Among a general field intensity meter, a dipole antenna, a LISN (Line Impedance Stabilized Network) circuit, or an absorbing clamp, which are used for the measurement of the electromagnetic waves, the field intensity meter was used.

As such, since the field intensity meter may be equally substituted with a short wave filter having a peak amplitude reduced by 6 dB compared to the peak of a Gaussian filter, as a short wave filter useful for the measurement of impulse noise, the field strength was measured in the frequency band from 30 MHz to 1 GHz in the state of the band width being set at a peak amplitude reduced by 6 dB or less.

In this case, a wave detector having a quasi-peak was used. The electromagnetic waves were measured using the field intensity meter at a position spaced apart by 3 m from the PDP filter according to the measurement standard of Class B, which is the FCC international standard for a digital apparatus such as a PDP with respect to electromagnetic waves.

The thick full line representing Class B in FIGS. 20 to 25 designates a maximum guideline for electromagnetic waves emitted from a digital apparatus as set by the FCC international standard.

As shown in FIGS. 20 and 21, the PDP filter of Example 1 having the electromagnetic wave-shielding film without the ground portion does not exceed the guideline of Class B in the electromagnetic wave range actually emitted from the PDP, and thus satisfies the international standard.

Comparing FIGS. 20 and 21 with FIGS. 22 to 25, the PDP filter having the electromagnetic wave-shielding film without the ground portion of Example 1 can be seen to show a field intensity wave form that is very similar to those of the conventional PDP filters having electromagnetic wave-shielding films with ground portions of Comparative Examples 1 and 2.

Consequently, in the case of using the process of forming the PDP filter having the electromagnetic wave-shielding layer without the ground portion, the PDP filter can be more easily and simply manufactured compared to conventional techniques using an electromagnetic wave-shielding film having a ground portion. Moreover, an electromagnetic wave-shielding effect equal to that of a conventional PDP filter can be achieved.

INDUSTRIAL APPLICABILITY

According to the present invention, the laminated structure of the PDP filter can be variously formed, and as well, a continuous manufacturing process, such as a roll-to-roll process, may be applied upon manufacturing of the PDP filter, thus accomplishing mass production and high productivity of the PDP filter. In addition, functional layers requiring a structure that is functionally the same as part of the the structure of the transparent conductive film type electromagnetic wave-shielding layer may be formed into a simple structure, thereby enabling easy manufacture of a multi-functional PDP filter.

The invention claimed is:

1. A PDP (Plasma Display Panel) filter, having a laminated structure comprising a transparent conductive film type electromagnetic wave-shielding layer and one or more other functional layers, in which none of four edge portions of a surface of the transparent conductive film type electromagnetic wave-shielding layer, which is in contact with the functional layer, are exposed outside the laminated structure of the PDP filter, wherein a width of the functional layer is equal to a corresponding width of the transparent conductive film type electromagnetic wave-shielding layer, and the transparent conductive film type electromagnetic wave-shielding layer is not electrically grounded.

2. The PDP filter according to claim 1, wherein the other functional layer is a layer selected from the group consisting of an anti-reflection layer, a near infrared absorbing layer, and a color control layer, or a layer capable of exhibiting two or more functions among functions of said layers.

3. The PDP filter according to claim 1, wherein the other functional layer is an anti-reflection layer.

4. The PDP filter according to claim 3, wherein the anti-reflection layer is disposed on an uppermost surface of the laminated structure to which external light is applied.

5. The PDP filter according to claim 1, wherein the transparent conductive film type electromagnetic wave-shielding layer comprises one or more high-refractive transparent thin film layers and one or more metal thin film layers, which are alternately laminated, and a high-refractive transparent thin film layer provided on an uppermost surface of the alternately laminated layers.

6. The PDP filter according to claim 5, wherein the high-refractive transparent thin film layer is formed of at least one selected from the group consisting of ITO, IZO, ATO, ZnO, ZnO-Al, $TiO_2$, $Nb_2O_3$, SnO, indium oxide, titanium oxide, zirconium oxide, tin oxide, zinc oxide, antimony oxide, tantalum oxide, cerium oxide, thorium oxide, magnesium oxide, potassium oxide, and $Si_3N_4$.

7. The PDP filter according to claim 5, wherein the metal thin film layer is formed of at least one selected from the group consisting of gold, silver, copper, nickel, and aluminum.

8. The PDP filter according to claim 1, wherein the electromagnetic wave-shielding layer and the other functional layer are laminated by adhesion using a roll-to-roll process.

9. The PDP filter according to claim 8, further comprising a pressure sensitive adhesive layer or a hot-melt resin layer between the electromagnetic wave-shielding layer and the other functional layer, which is in contact with the electromagnetic wave-shielding layer.

10. The PDP filter according to claim 1, wherein the other functional layer is formed on the electromagnetic wave-shielding layer by using a coating process.

11. The PDP filter according to claim 1, further comprising a color control Layer.

12. The PDP filter according to claim 11, wherein the color control layer is formed by adding a pigment or a dye to an inter-layer adhesive layer.

13. The PDP filter according to claim 11, wherein the color control layer is formed by attaching a color control film to the PDP filter using a roll-to-roll process.

14. A PDP, comprising the PDP filter of claim 1.

15. The PDP according to claim 14, wherein the PDP filter is attached to the PDP through a glass substrate.

16. The PDP according to claim 14, wherein the PDP filter is directly attached to a PDP module.

17. A method of manufacturing a PDP (Plasma Display Panel) filter, comprising forming one or more other functional layers on an upper surface, a lower surface or both surfaces of a transparent conductive film type electromagnetic wave-shielding layer using a coating process, in which the coating process is performed on an entire surface of the coating surface of a transparent conductive film type electromagnetic wave-shielding film so as not to expose all edge portions of the coating surface of the transparent conductive film type electromagnetic wave-shielding film, wherein a width of the functional layer is equal to a corresponding width of the transparent conductive film type electromagnetic wave-shielding layer, and the transparent conductive film type electromagnetic wave-shielding layer is not electrically grounded.

18. A PDP (Plasma Display Panel) filter, comprising a transparent substrate, a transparent conductive film type electromagnetic wave-shielding layer including high-refractive transparent thin film layers and metal thin film layers that are alternately laminated on the transparent substrate and a high-refractive transparent thin film layer provided on an uppermost surface of the alternately laminated layers, and a low-refractive transparent thin film layer formed on the uppermost high-refractive transparent thin film layer, in which none of four edge portions of a surface of the transparent conductive film type electromagnetic wave-shielding layer, which is in contact with the low-refractive transparent thin film layer, are exposed, wherein a width of the functional layer is equal to a corresponding width of the transparent conductive film type electromagnetic wave-shielding layer and the transparent conductive film type electromagnetic wave-shielding layer is not electrically grounded.

19. The PDP filter according to claim 18, wherein the high-refractive transparent thin film layer is formed of at least one selected from the group consisting of ITO, IZO, ATO, ZnO, ZnO-Al, $TiO_2$, $Nb_2O_2$, SnO, indium oxide, titanium oxide, zirconium oxide, tin oxide, zinc oxide, antimony oxide, tantalum oxide, cerium oxide, thorium oxide, magnesium oxide, potassium oxide, and $Si_3N_4$.

20. The PDP filter according to claim 18, wherein the metal thin film layer formed of at least one selected from the group consisting of gold, silver, copper, nickel, and aluminum.

21. The PDP filter according to claim 18, wherein the low-refractive transparent thin film layer is formed by sputtering or vacuum depositing a low-refractive inorganic layer.

22. The PDP filter according to claim 18, wherein the low-refractive transparent thin film layer is formed by microgravure coating or wet coating a copolymer comprising a fluorine-based low-refractive monomer and an acrylic monomer or a fluorinated polymer.

23. The PDP filter according to claim 18, further comprising a hard coating layer between the transparent substrate and a lowermost high-refractive transparent thin film layer of the transparent conductive film type electromagnetic wave-shielding layer.

24. The PDP filter according to claim 23, wherein the hard coating layer is formed of a UV curable composition including urethane-acrylate, epoxy-acrylate, or polyester-acrylate.

25. The PDP filter according to claim 18, further comprising a color control layer.

26. The PDP filter according to claim 25, wherein the color control layer is formed by adding a pigment or a dye to an inter-layer adhesive layer.

27. The PDP filter according to claim 25, wherein the color control layer is formed by attaching a color control film to the PDP filter using a roll-to-roll process.

28. A PDP, comprising the PDP filter of claim 18.

29. The PDP according to claim 28, wherein the PDP filter is attached to the PDP through a glass substrate.

30. The PDP according to claim 28, wherein the PDP filter is directly attached to the PDP module.

31. A method of manufacturing a PDP (Plasma Display Panel) filter, comprising: alternately laminating high-refractive transparent thin film layers and metal thin film layers on a transparent substrate, and providing a high-refractive transparent thin film layer on an uppermost surface of the alternately laminated layers, thus forming a transparent conductive film type electromagnetic wave-shielding layer; and forming a low-refractive transparent thin film layer on the uppermost high-refractive transparent thin layer film layer, in which none of four edge portions of a surface of the transparent conductive film type electromagnetic wave-shielding layer, which is in contact with the low-refractive transparent thin film layer, are exposed, wherein a width of the functional layer is equal to a corresponding width of the transparent conductive film type electromagnetic wave-shielding layer, and the transparent conductive film type electromagnetic wave-shielding layer is not electrically grounded.

* * * * *